US012566221B2

(12) United States Patent
Tabor et al.

(10) Patent No.: US 12,566,221 B2
(45) Date of Patent: Mar. 3, 2026

(54) POWER DISTRIBUTION BUSWAY TESTING

(71) Applicant: Google LLC, Mountain View, CA (US)

(72) Inventors: Michal Tabor, Leesburg, VA (US); Jay Robert Prigmore, II, Oswego, IL (US); Adam Paul Horton, Crescent, IA (US); Paul Edward Gorsky, II, Summerville, SC (US)

(73) Assignee: Google LLC, Mountain View, CA (US)

( * ) Notice: Subject to any disclaimer, the term of this patent is extended or adjusted under 35 U.S.C. 154(b) by 161 days.

(21) Appl. No.: 18/385,163

(22) Filed: Oct. 30, 2023

(65) Prior Publication Data

US 2025/0138107 A1      May 1, 2025

(51) Int. Cl.
      *G01R 31/62* (2020.01)
      *G01R 31/58* (2020.01)
(52) U.S. Cl.
      CPC ............. *G01R 31/62* (2020.01); *G01R 31/58* (2020.01)
(58) Field of Classification Search
      CPC .... G01R 31/62; G01R 31/58; G01R 19/2513; H02J 3/0012; H02J 3/40
      See application file for complete search history.

(56) References Cited

U.S. PATENT DOCUMENTS

| | | | |
|---|---|---|---|
| 2,928,996 A | 3/1960 | Markowitz | |
| 7,991,588 B1 * | 8/2011 | Krieger | G06F 11/3034 702/186 |

| | | | |
|---|---|---|---|
| 2017/0373630 A1 * | 12/2017 | Figie | H02P 29/024 |
| 2018/0069442 A1 | 3/2018 | Ma et al. | |
| 2019/0120890 A1 * | 4/2019 | Patel | G01K 1/14 |
| 2019/0190219 A1 | 6/2019 | Cook et al. | |
| 2019/0257893 A1 * | 8/2019 | Na | G01R 19/165 |
| 2021/0159723 A1 * | 5/2021 | Ho | H02J 9/062 |

FOREIGN PATENT DOCUMENTS

| | | | | |
|---|---|---|---|---|
| CN | 204858910 U | 12/2015 | | |
| EP | 3267211 A1 * | 1/2018 | ......... | G01R 31/1272 |
| IN | 201821012011 A * | 10/2019 | | |

OTHER PUBLICATIONS

Instruction Manual. 2012. AC Generator, Center Air Discharge. Publication 350-01015-00. Nidec, Kato Engineering, Inc. 48 pages.
Extended European Search Report for European Patent Application No. 24209433.2 dated Mar. 28, 2025. 9 pages.

* cited by examiner

*Primary Examiner* — Feba Pothen
(74) *Attorney, Agent, or Firm* — Lerner David LLP

(57)                    ABSTRACT

Generally disclosed herein is a method for synthesizing low-voltage power flow in an electrical distribution system. The method may include connecting a generator to the electrical distribution system. The generator may include a voltage regulator and excitation system. The electrical distribution system may be shorted with a shunt. The output voltage of the generator may be manually set using the voltage regulator. The output current of the generator may be set using the excitation system. The generator may then generate a power flow with the set output voltage and the set output current. The power flow may be supplied to the electrical distribution system.

18 Claims, 5 Drawing Sheets

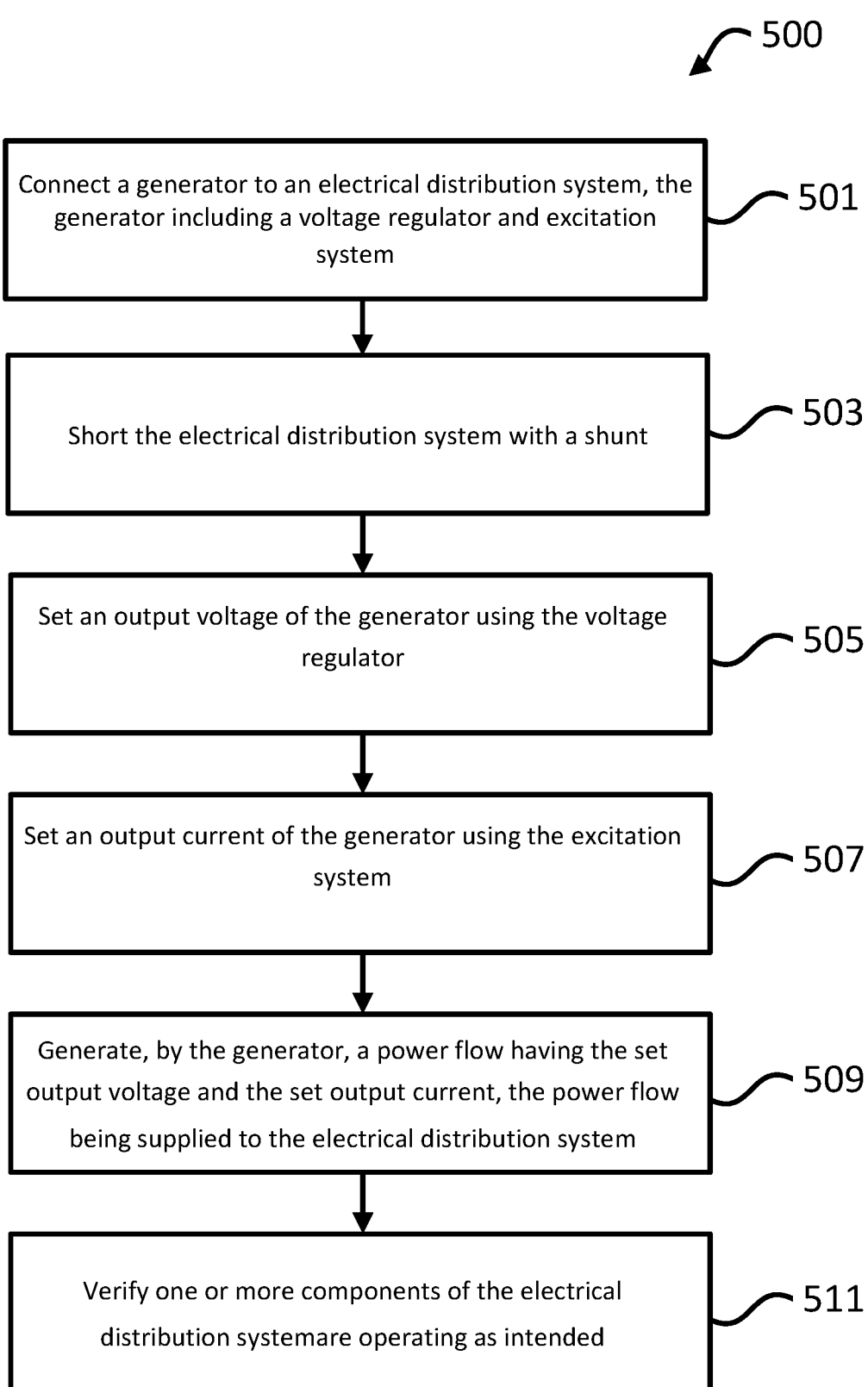

500

Connect a generator to an electrical distribution system, the generator including a voltage regulator and excitation system ⁓ 501

Short the electrical distribution system with a shunt ⁓ 503

Set an output voltage of the generator using the voltage regulator ⁓ 505

Set an output current of the generator using the excitation system ⁓ 507

Generate, by the generator, a power flow having the set output voltage and the set output current, the power flow being supplied to the electrical distribution system ⁓ 509

Verify one or more components of the electrical distribution systemare operating as intended ⁓ 511

FIG. 5

POWER DISTRIBUTION BUSWAY TESTING

BACKGROUND

Electrical distribution systems deliver power from an electrical power system to a load. Electrical distribution systems, such as those found in data centers for delivering electrical power from electrical power systems to loads, such as server racks, typically include power distribution busways. Power distribution busways are often modular and include busway sections interconnected with busway joints. The installation of these busway sections and joints requires following specific installation guidelines, such as proper alignment of the two adjoining busway sections per the manufacturer's instructions, proper mating hardware to be installed per the manufacturer's instructions, proper cleaning of the adjoining busway sections, proper prepping of the adjoining busway sections per manufacturer's instructions, as well as torquing procedures for proper installation.

To check for proper installation of power distribution busways including installation of the joints and busway sections, testing and commissioning steps may be taken. Such testing and commissioning may include torque verification, alignment verification, digital low-resistance ohmmeter testing, insulation resistance testing, infrared thermography, and power (current) injection testing. Current methods of testing the installation of joints typically include bus torquing, voltage drop detection methods (e.g., measuring the voltage drop of a power flow across a joint), and thermal scanning under full or partial load to validate joint connections utilizing system resistance to locate and identify improperly installed, or defective, joints.

SUMMARY

Generally disclosed herein are systems and methods for synthesizing low-voltage power flow in an electrical distribution system to verify the connections of the joints in the electrical distribution system are made properly. Electrical distribution systems commonly include joints where sections of the electrical distribution system are joined together. Improper installation of the joints or faulty components within the joints may lead to risks such as damage or failure to the electrical distribution system or attached equipment and fire. To reduce these risks, the joints may be tested using a synthesized low-voltage power flow generated by an electrical power generation unit to identify excessive heat or voltage drop anomalies indicating improperly installed and/or faulty joints.

An aspect of the disclosure provides a method for synthesizing low-voltage power flow in an electrical distribution system. The method may comprise: connecting a generator to the electrical distribution system, the generator including a voltage regulator and excitation system; shorting the electrical distribution system with a shunt; setting an output voltage of the generator using the voltage regulator; setting an output current of the generator using the excitation system; and generating, by the generator, a power flow having the set output voltage and the set output current, the power flow being supplied to the electrical distribution system.

In some instances, prior to setting the output voltage of the regulator, disabling automatic voltage regulation of the voltage regulator.

In some instances, the electrical distribution system includes a power distribution busway comprising a plurality of busway sections interconnected by a plurality of busway joints. In some examples, the plurality of busway joints are mechanical joints and/or compression joints.

In some instances, the plurality of busway sections and the plurality of busway joints each include three or more power rails. In some examples, the plurality of busway sections and the plurality of busway joints each include at least a positive rail, a negative rail, and a ground rail. In some examples, the shunt is attached between power rails of a busway section of the plurality of busway sections at an end of the power distribution busway.

In some instances, the method includes testing the plurality of busway joints.

In some examples, the testing comprises measuring, for each of the plurality of busway joints, a voltage drop of the power flow across the respective busway joint; and identifying defective and/or improperly installed busway joints based on the measured voltage drops, wherein each busway joint of the plurality of busway joints having a measured voltage drop greater than a threshold value is identified as defective and/or improperly installed.

In some examples, the testing comprises thermal scanning of each of the plurality of busway joints to determine a temperature of each of the plurality of busway joints. In some examples, each busway joint of the plurality of busways joints having a temperature greater than a threshold value is identified as defective and/or improperly installed.

In some instances, the electrical distribution system includes a power distribution busway comprising two or more branches, wherein each branch includes one or more busway joints and one or more busway sections.

In some examples, the method further comprises directing the power flow to a first of the two or more branches; and testing the one or more busway joints within the first of the two or more branches.

In some examples, the method further comprises directing the power flow to a second of the two or more branches; and testing the one or more busway joints within the second of the two or more branches.

In some instances, the electrical distribution system further includes a current transformer, and the method further comprises testing the current transformer.

In some examples, the testing comprises measuring the power flow through the current transformer; and identifying the current transformer as defective and/or improperly installed based on the measured power flow by comparing the measured power flow against expected power flow through the current transformer. In some examples, the testing comprises thermal scanning the current transformer to determine a temperature; and identifying the current transformer as defective and/or improperly installed based on the temperature being greater than a threshold value.

In some instances, the electrical distribution system further includes cable terminations, the method further comprising testing the cable terminations. In some examples, the testing comprises, for each of the cable terminations, a voltage drop of the power flow across the respective cable termination; and identifying defective and/or improperly installed cable terminations based on the measured voltage drops, wherein each cable termination of the cable terminations having a measured voltage drop greater than a threshold value is identified as defective and/or improperly installed. In some examples, the testing comprises thermal scanning of each of the cable terminations to determine a temperature of each of the cable terminations, wherein each cable termination of the cable terminations having a temperature greater than a threshold value is identified as defective and/or improperly installed.

BRIEF DESCRIPTION OF THE DRAWINGS

FIG. 5 is a flow chart illustrating a method for synthesizing a low-voltage power flow in an electrical distribution system in accordance with aspects of the disclosure.

DETAILED DESCRIPTION

The present disclosure relates to systems and methods for synthesizing low-voltage power flow in an electrical distribution system to verify the connections of the joints in the electrical distribution system are made properly and operating as intended. Techniques to locate and identify improperly installed and defective joints in an electric distribution system include voltage drop detection methods (e.g., measuring the voltage drop of a power flow across a joint) and thermal scanning under full or partial load to validate joint connections utilizing system resistance, require the use of load banks and the delivery of full or partial power to the electrical distribution system to validate this installation.

As used herein, full power (Wmax) may be considered the power level at the maximum rated voltage (Vmax) and maximum rated current (Imax) of a power distribution busway, where Wmax=Vmax*Imax. Partial power may be considered any power level >40% of full power (Wmax). Low power may be considered any power level <=40% of full power (Wmax). In instances where multiple phases of power are provided, Wmax=Vmax*Imax*$\sqrt{3}$.

To flow full or partial power through the electrical distribution system, a synthetic load, sometimes referred to as a substitute load, is normally attached to the electrical distribution system. For example, a synthetic load may include a load bank capable of safely dissipating the power delivered to the electrical distribution system during testing as heat. In this regard, while some power may be dissipated by the electrical distribution system itself, such dissipation would account for only a fraction of the full power. Thus, much of the delivered power would be dissipated by the load bank. However, such load banks are expensive to purchase and/or rent. Additionally, the use of load banks can add significant delays and costs to the installation of electrical distribution systems. Moreover, utilizing load banks introduces safety risks and human error risks from continuously relocating the load bank to different electrical distribution systems and circuits.

The technology described herein may synthesize low-voltage power flow in an electrical distribution system, such as a power distribution busway, to verify proper joint connections and functionality without the need for a synthetic load. Thus, significant cost and time savings may be achieved. Further, applying a synthesized low-voltage power flow reduces the risk of damage to the power distribution busway dielectrically. Additionally, synthesizing a low-voltage power flow in the power distribution busway minimizes the risks involved in applying a high-voltage signal to an electrical distribution system, such as overheating and fire hazards, as only a low-voltage signal is provided.

Figure 1:
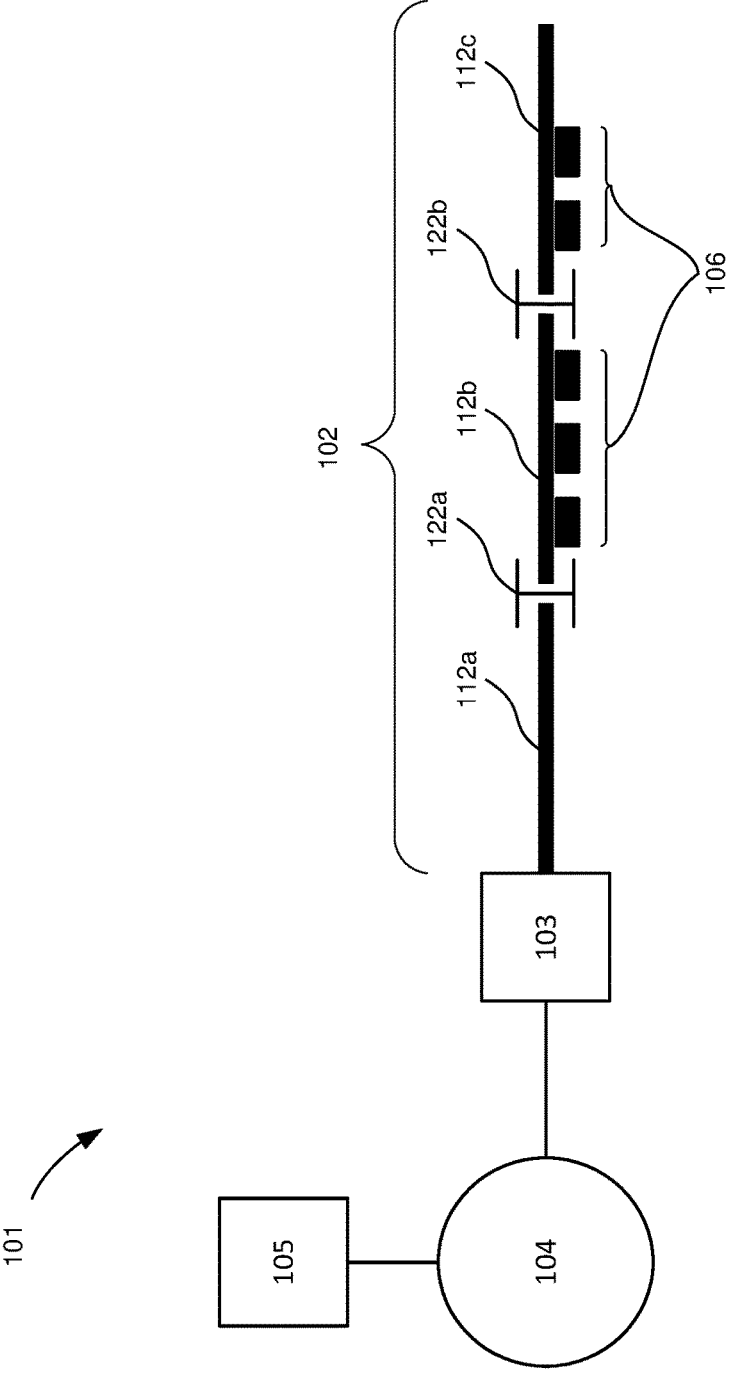
FIG. 1 is an illustration of an electrical distribution system including a power distribution busway in accordance with aspects of the disclosure.

FIG. 1 is an illustration of an electrical distribution system 101, including a power distribution busway 102. A power source, illustrated as generator 104, is connected to the power distribution busway 102 via transformer 103. The amount of power flow output by the generator 104 onto the power distribution busway 102 is typically controlled by an automatic voltage regulator 105. Although the automatic voltage regulator 105 is illustrated as being a distinct component from the generator 104, the automatic voltage regulator 105 may be a component of the generator.

The transformer 103 may be configured to adjust the voltage level of the power flow generated by the generator 104, such as by increasing or decreasing the voltage level and delivering power to the load(s). In some instances, an electrical distribution system may have no transformers or more than one transformer.

The power distribution busway 102 includes busway sections 112a, 112b, and 112c. The busway sections 112a, 112b, and 112c are connected via busway joints 122a and 122b. The busway joints may be compression joints, mechanical joints, or other such components capable of connecting two or more busway sections together, such as cable joints.

Figure 2:
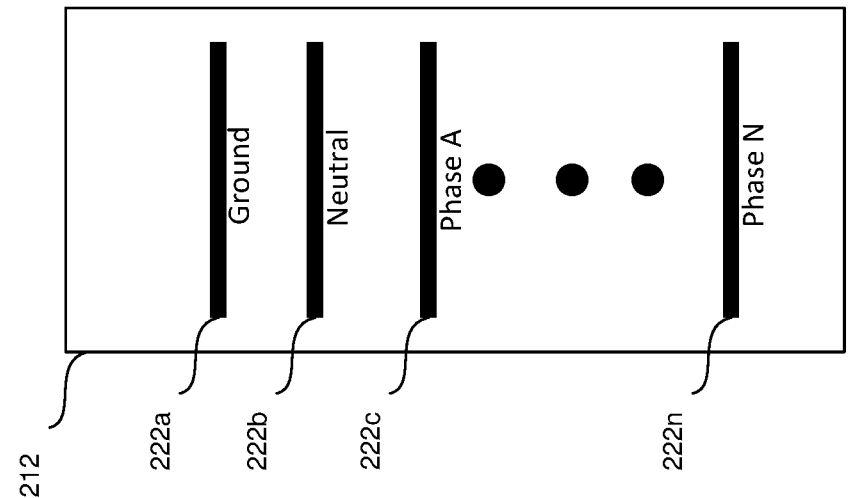
FIG. 2 is an illustration of rails within a cutaway view of an example busway section in accordance with aspects of the disclosure.

The power distribution busway 102 may include rails to carry the power flow. Each rail may carry a power phase, neutral, and/or ground. For instance, and as illustrated in the cutaway view of an example busway section 212 of FIG. 2, the busway may include rails 222a-222n. Rail 222a carries ground, rail 222b carries neutral, 222c carries phase A, and 222n carries phase N. Although busway section 212 is illustrated as carrying "N" phases, a typical busway section may include 1-3 phases, for a total of between 3 and 5 rails. In some instances, each branch of a busway section may have the same or a different number of rails relative to another busway section.

Each busway section may include bus taps. For instance, and referring back to FIG. 1, busway sections 112b and 112c include bus taps 106. Busway section 112b includes three bus taps 106, and busway section 112c includes two bus taps 106. The bus taps may be connection points for loads. In this regard, the bus taps may deliver power flow from the power distribution busway 102 to loads, such as server racks. In some instances, an intermediary connection, such as a wire, bus, or other such connection mechanism, may connect the bus tap to the loads. Each bus tap may connect to any number of loads.

The illustration of power distribution busway 102 is merely for example purposes and may be configured to include more or fewer busway sections, busway joints, and bus taps. For example, a power distribution busway may include any number of busway sections joined together by busway joints. Each busway section may include any number of busway taps. Moreover, each busway joint may join more than two busways such that the power distribution busway may split into any number of branches. For instance, a busway joint may connect three busway sections, thereby splitting the busway into two separate branches.

Figure 3:
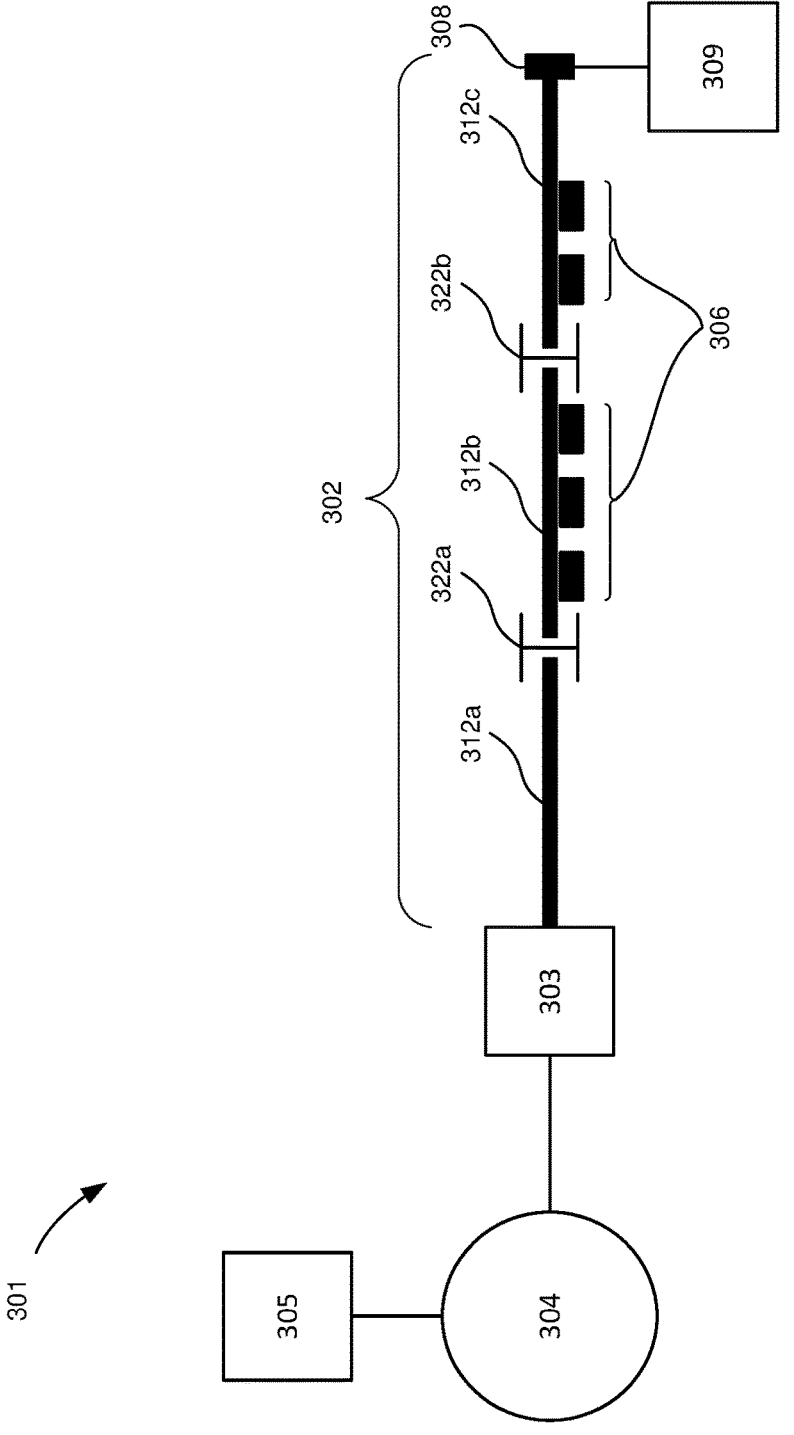
FIG. 3 is an example configuration of an electrical distribution system attached to a load bank for testing busway joint connections.

FIG. 3 illustrates the configuration of an electrical distribution system 301 attached to a load bank 309 for testing busway joint connections. The electrical distribution system 301 may be compared with electrical distribution system 101. In this regard, electrical distribution system 301 includes a power source, illustrated as generator 304, connected to the power distribution busway 302 via transformer 303. An automatic voltage regulator 305 may control the amount of power flow output by the generator 304 onto the power distribution busway 302. The power distribution busway 302 includes busway sections 312*a*, 312*b*, and 312*c*. The busway sections 312*a*, 312*b*, and 312*c* are connected via busway joints 322*a* and 322*b*. The busway sections include bus taps 306.

As further shown in FIG. 3, a synthetic load-load bank 309 is attached to a bus tap positioned at the end of the power distribution busway 302. The bus tap to which load bank 309 is connected is referred to as end tap 308. To test the integrity of the busway joints 322*a* and 322*b*, full or partial power flow is pulled through the electrical distribution system 301 by the load bank 309 from the generator 304. The voltage of the signal output by the generator 304 is controlled by the automatic voltage regulator 305. While the load bank is pulling full or partial power flow through the power distribution busway, known techniques may be used to locate and identify improperly installed and defective busway joints in the power distribution busway 302. Such techniques may include voltage drop detection methods and thermal scanning.

To synthesize low-voltage power flow, and thereby remove the need for a synthetic load when testing the integrity of busway joints, the power source may be converted to or otherwise made to act as a constant current source. Additionally, the end of the distribution path of the power distribution busway may be shorted by placing a shunt between power rails at the end of the power distribution busway.

Figure 4:
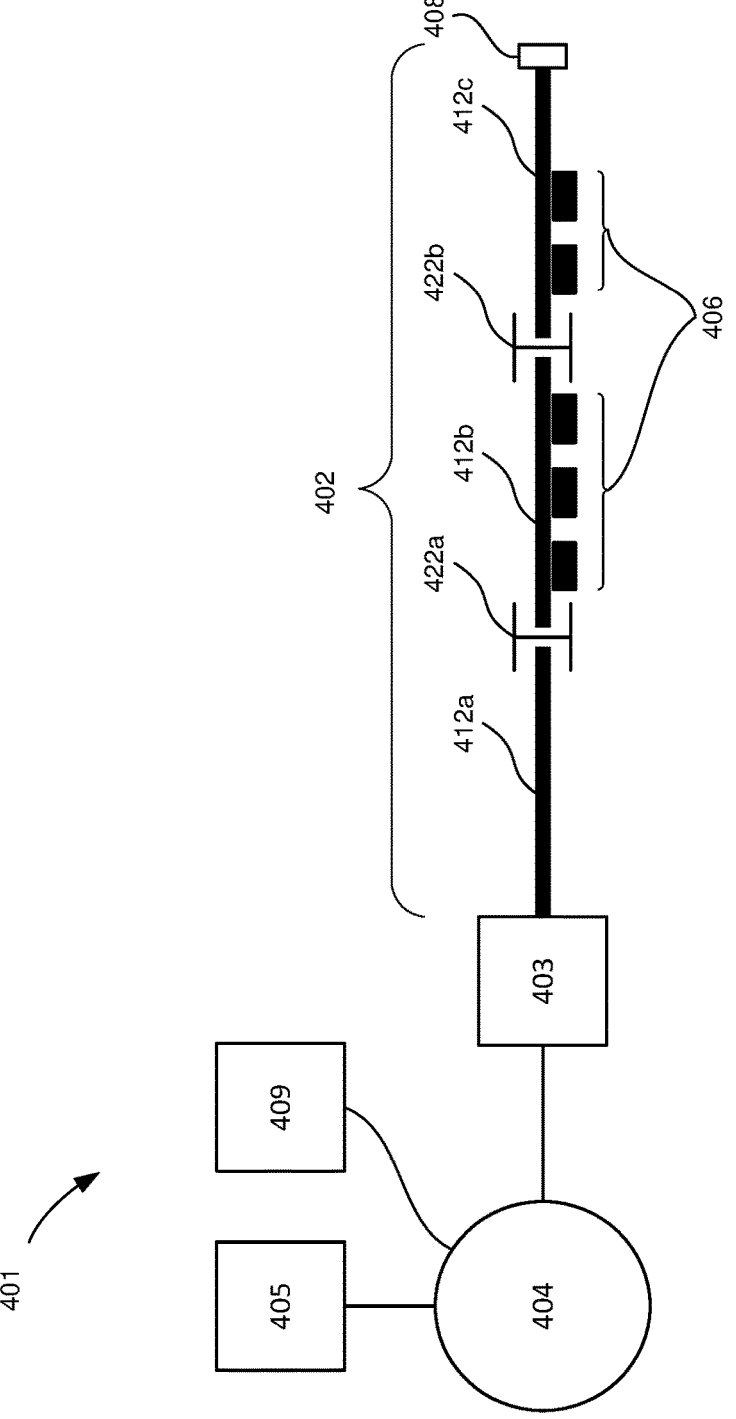
FIG. 4 illustrates a configuration of an electrical distribution system having shorted power rails and a power source configured to act as a constant current source for use in testing according to aspects of the disclosure.

For example, FIG. 4 illustrates the configuration of an electrical distribution system 401 having shorted power rails and a power source configured to act as a constant current source. The electrical distribution system 401 may be compared with electrical distribution system 101. In this regard, electrical distribution system 401 includes a power source, illustrated as generator 404, connected to the power distribution busway 402 via transformer 403. The power distribution busway 402 includes busway sections 412*a*, 412*b*, and 412*c*. The busway sections 412*a*, 412*b*, and 412*c* are connected via busway joints 422*a* and 422*b*. The busway sections include bus taps 406.

As further shown in FIG. 4, a shunt 408 is placed across, or otherwise attached to, the rails of busway section 412*c*. In instances where a power distribution busway includes more than one branch, shunts may be placed at the end of each branch. The automatic voltage regulator 405 may be placed into a manual mode. An excitation system, in this example, variable power supply 409, is connected to generator 404. Although FIG. 4 illustrates the variable power supply 409 as being external to generator 404, the excitation system may be integrated into generator 404.

By disabling any automatic voltage regulation features of the generator and using the generator's excitation system, a power flow having a large current and low voltage may be output by the generator. In this regard, the voltage regulator 405 of the generator 404 may be manually set. For example, the voltage may be set to a low voltage level, such as between 1V and 50V. In other instances, the voltage level may be dependent on the circuit impedance (e.g., impedance of the busway sections, busway joints, etc.) and current supplied by the excitation system. In such an instance, the voltage level would equal circuit impedance×current.

The excitation system may be configured to deliver a power flow having a particular amount of current at the manually set voltage level (e.g., 1V to 50V) to the power distribution busway. The amount of current (amperage) that is delivered from the excitation system must be within the generator's continuous current maximum limit. The current applied to the power distribution busway 402 within a power flow may be a constant current. Thus, by manually setting the voltage and using the variable power supply 409, the generator 404 operates as a constant current source. Although the current output by the generator 404 is described as a constant current, the current level may be ramped up to the constant level. The current may then be maintained at a constant level long enough to generate heat in the electrical distribution system 401, including the power distribution busway 402, so that heat anomalies may be detected.

By shorting the power distribution busway with a shunt and delivering a power flow having a particular level of current at a low voltage to the power distribution busway, the electrical characteristics of the power distribution busway, including those of the connection joints, would be comparable to electrical characteristics if full or partial power was delivered to the power distribution bus. Thus, heat and/or voltage drop anomalies may be detected using detection techniques, such as thermal scanning or voltage drop detection methods.

In some instances, voltage drop anomalies may be detected by measuring, at the busway joints, such as busway joints 422*a* and 422*b*, a voltage drop of the power flow across the respective busway joints. A defective or improperly installed busway joint may be determined by comparing the measured voltage drops to a threshold value. When the voltage drop across a busway joint is greater than, and in some instances, equal to, the threshold value, the busway joint may be identified as defective and/or improperly installed.

In some examples, heat anomalies may be detected by measuring the temperature of the busway joints. When the measured temperature is greater than, and in some instances, equal to, a threshold value, the busway joint may be identified as defective and/or improperly installed.

Although the technology is described herein as being used to test a power distribution busway, the technology can be used to test other electrical distribution systems that include joints such as cable terminations. Moreover, although bus joints and other joints are described as being tested, other components, such as measurement sensors, current transformers, cable terminations, etc., can be tested for proper installation using the methods described herein. For instance, to test current transformers, the power flow through the current transformer may be measured. The measured power flow may then be compared against the expected power flow to determine if they match or are within a threshold value of each other. If the values do not match or are outside of the threshold value, the current transformer may be identified as defective and/or improperly installed.

In some instances, the power flow delivered by the generator 404 can be diverted to other parts of the electrical distribution system 401 by closing and opening circuit breakers (not shown). By doing such, the power flow may be delivered to different devices and or branches within the electrical distribution system 401, including in the power distribution busway 402. Thus, a portion of the components within the electrical distribution system 401 can be tested. Moreover, by modifying the power system state by opening and closing breakers, the synthesized low-voltage power flow can also be diverted to various locations within the electrical distribution system 401, such as medium voltage and high voltage locations, to test components in those locations. Moreover, although the synthesized power flow described herein is described as low-voltage (e.g., <=1, 000V, higher-voltage power flows (>1,000 volts) may also be synthesized.

FIG. 5 depicts a flow diagram illustrating an example method 500 for synthesizing low-voltage power flow in an electrical distribution system. The operations involved in the following methods need not be performed in the precise order described. Rather, various operations may be handled in a different order or simultaneously, and operations may be added or omitted.

The method may include connecting a generator to an electrical distribution system, as shown in block 501. The generator may include or otherwise be attached to a voltage regulator and excitation system. The electrical distribution system may be shorted with a shunt, as shown in block 503. As explained herein, the shunt may be placed across rails that carry the power flow, such as rails with busway sections of a power distribution busway.

As shown in blocks 505 and 507, respectively, the output voltage of the generator may be manually set using the voltage regulator, and the output current of the generator may be set using the excitation system. As described herein, the excitation system may be, for example, a variable power supply. The generator may then generate a power flow having the set output voltage and the set output current, as shown in block 509. The power flow may be supplied to the electrical distribution system. With the power flow being supplied to the electrical distribution system, or after the power flow has been supplied to the electrical distribution system, one or more components of the electrical distribution system may be tested to verify whether they are operating as intended, as shown in block 511. Such verification may include determining whether the component is installed correctly.

Although the technology herein has been described with reference to particular examples, it is to be understood that these examples are merely illustrative of the principles and applications of the present technology. It is, therefore, to be understood that numerous modifications may be made and that other arrangements may be devised without departing from the spirit and scope of the present technology as defined by the appended claims.

Unless otherwise stated, the foregoing alternative examples are not mutually exclusive but may be implemented in various combinations to achieve unique advantages. As these and other variations and combinations of the features discussed above can be utilized without departing from the subject matter defined by the claims, the foregoing description should be taken by way of illustration rather than by way of limitation of the subject matter defined by the claims. In addition, the provision of the examples described herein, as well as clauses phrased as "such as," "including," and the like, should not be interpreted as limiting the subject matter of the claims to the specific examples; rather, the examples are intended to illustrate only one of many possible implementations. Further, the same reference numbers in different drawings can identify the same or similar elements.

The invention claimed is:

1. A method for synthesizing low-voltage power flow in an electrical distribution system, the method comprising:

connecting a generator to the electrical distribution system, the generator including a voltage regulator and excitation system;

shorting the electrical distribution system with a shunt;

setting an output voltage of the generator using the voltage regulator;

setting an output current of the generator using the excitation system;

generating, by the generator, a power flow having the set output voltage and the set output current, the power flow being supplied to the electrical distribution system, wherein the electrical distribution system includes a power distribution busway comprising two or more branches, and wherein each branch includes one or more busway joints and one or more busway sections;

directing the power flow to a first of the two or more branches; and testing the one or more busway joints within the first of the two or more branches.

2. The method of claim 1, further comprising, prior to setting the output voltage of the regulator, disabling automatic voltage regulation of the voltage regulator.

3. The method of claim 1, wherein the electrical distribution system includes a power distribution busway comprising a plurality of busway sections interconnected by a plurality of busway joints.

4. The method of claim 3, wherein the plurality of busway joints are mechanical joints and/or compression joints.

5. The method of claim 3, wherein the plurality of busway sections and the plurality of busway joints each include three or more power rails.

6. The method of claim 5, wherein the plurality of busway sections and the plurality of busway joints each include at least a positive rail, a negative rail, and a ground rail.

7. The method of claim 5, wherein the shunt is attached between power rails of a busway section of the plurality of busway sections at an end of the power distribution busway.

8. The method of claim 3, further comprising testing the plurality of busway joints.

9. The method of claim 8, wherein the testing comprises:

measuring, for each of the plurality of busway joints, a voltage drop of the power flow across the respective busway joint; and identifying defective and/or improperly installed busway joints based on the measured voltage drops, wherein each busway joint of the plurality of busway joints having a measured voltage drop greater than a threshold value is identified as defective and/or improperly installed.

10. The method of claim 8, wherein the testing comprises:

thermal scanning of each of the plurality of busway joints to determine a temperature of each of the plurality of busway joints.

11. The method of claim 10, wherein each busway joint of the plurality of busways joints having a temperature greater than a threshold value is identified as defective and/or improperly installed.

12. The method of claim 1, further comprising:

directing the power flow to a second of the two or more branches; and testing the one or more busway joints within the second of the two or more branches.

13. The method of claim 1, wherein the electrical distribution system further includes a current transformer, the method further comprising:

testing the current transformer.

14. The method of claim 13, wherein the testing comprises:

measuring the power flow through the current transformer; and identifying the current transformer as defective and/or improperly installed based on the measured power flow by comparing the measured power flow against expected power flow through the current transformer.

15. The method of claim 13, wherein the testing comprises:

thermal scanning the current transformer to determine a temperature; and identifying the current transformer as defective and/or improperly installed based on the temperature being greater than a threshold value.

16. The method of claim 1, wherein the electrical distribution system further includes cable terminations, the method further comprising:

testing the cable terminations.

17. The method of claim 16, wherein the testing comprises:

for each of the cable terminations, a voltage drop of the power flow across the respective cable termination; and identifying defective and/or improperly installed cable terminations based on the measured voltage drops, wherein each cable termination of the cable terminations having a measured voltage drop greater than a threshold value is identified as defective and/or improperly installed.

18. The method of claim 16, wherein the testing comprises:

thermal scanning of each of the cable terminations to determine a temperature of each of the cable terminations, wherein each cable termination of the cable terminations having a temperature greater than a threshold value is identified as defective and/or improperly installed.

* * * * *